(12) United States Patent
Joshi et al.

(10) Patent No.: US 12,044,963 B2
(45) Date of Patent: Jul. 23, 2024

(54) HIGH REFRACTIVE INDEX IMPRINT COMPOSITIONS AND MATERIALS AND PROCESSES FOR MAKING THE SAME

(71) Applicant: Applied Materials, Inc., Santa Clara, CA (US)

(72) Inventors: Amita Joshi, Fremont, CA (US); Ian Matthew McMackin, Mountain View, CA (US); Rami Hourani, Santa Clara, CA (US); Yingdong Luo, San Jose, CA (US); Sivapackia Ganapathiappan, Los Altos, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 366 days.

(21) Appl. No.: 16/941,304

(22) Filed: Jul. 28, 2020

(65) Prior Publication Data

US 2021/0223686 A1   Jul. 22, 2021

Related U.S. Application Data

(60) Provisional application No. 62/967,311, filed on Jan. 29, 2020, provisional application No. 62/964,408, filed on Jan. 22, 2020.

(51) Int. Cl.
| | |
|---|---|
| *G03F 7/00* | (2006.01) |
| *B29C 59/00* | (2006.01) |
| *B29C 71/02* | (2006.01) |
| *B29C 71/04* | (2006.01) |
| *C01G 23/04* | (2006.01) |

(Continued)

(52) U.S. Cl.
CPC .......... *G03F 7/0002* (2013.01); *B29C 59/005* (2013.01); *B29C 71/02* (2013.01); *B29C 71/04* (2013.01); *C01G 23/043* (2013.01); *C01G 25/02* (2013.01); *C01G 33/00* (2013.01);
(Continued)

(58) Field of Classification Search
None
See application file for complete search history.

(56) References Cited

U.S. PATENT DOCUMENTS

| | | | |
|---|---|---|---|
| 11,041,071 B2 * | 6/2021 | Tangirala | C08K 5/3467 |
| 2005/0255237 A1 | 11/2005 | Zhang et al. | |

(Continued)

FOREIGN PATENT DOCUMENTS

| | | |
|---|---|---|
| EP | 3428243 A1 | 1/2019 |
| JP | 2005527110 A | 9/2005 |

(Continued)

OTHER PUBLICATIONS

PCT International Search Report and Written Opinion dated Apr. 27, 2021, for International Application No. PCT/US2020/063596.

(Continued)

*Primary Examiner* — Robert J Grun
(74) *Attorney, Agent, or Firm* — Patterson + Sheridan, LLP

(57) ABSTRACT

Embodiments of the present disclosure generally relate to imprint compositions and materials and related processes useful for nanoimprint lithography (NIL). In one or more embodiments, an imprint composition contains one or more types of nanoparticles, one or more surface ligands, one or more solvents, one or more additives, and one or more acrylates.

20 Claims, 2 Drawing Sheets

(51) Int. Cl.
*C01G 25/02* (2006.01)
*C01G 33/00* (2006.01)
*B82Y 10/00* (2011.01)
*B82Y 40/00* (2011.01)

(52) U.S. Cl.
CPC .............. *B82Y 10/00* (2013.01); *B82Y 40/00* (2013.01); *C01P 2004/64* (2013.01)

(56) References Cited

U.S. PATENT DOCUMENTS

| | | |
|---|---|---|
| 2009/0028910 A1 | 1/2009 | DeSimone et al. |
| 2010/0109201 A1 | 5/2010 | Fletcher et al. |
| 2010/0209698 A1 | 8/2010 | Kornherr et al. |
| 2011/0064925 A1 | 3/2011 | Van Bommel et al. |
| 2013/0084442 A1* | 4/2013 | Akutagawa ............ B05D 3/108 524/265 |
| 2014/0072720 A1 | 3/2014 | Watkins et al. |
| 2015/0140837 A1 | 5/2015 | Chemin et al. |
| 2015/0283846 A1 | 10/2015 | Trexler et al. |
| 2015/0291815 A1 | 10/2015 | Verschuuren et al. |
| 2016/0109799 A1 | 4/2016 | Hernandez et al. |
| 2018/0273656 A1 | 9/2018 | Takagi et al. |
| 2019/0091950 A1 | 3/2019 | Hernandez Rueda et al. |
| 2019/0243237 A1 | 8/2019 | Watkins et al. |

FOREIGN PATENT DOCUMENTS

| | | |
|---|---|---|
| JP | 2008202022 A | 9/2008 |
| JP | 2010085864 A | 4/2010 |
| JP | 2011170073 A | 9/2011 |
| JP | 2011221365 A | 11/2011 |
| JP | 2017099184 A | 6/2017 |
| JP | 2019053304 A | 4/2019 |
| JP | 2020132857 A | 8/2020 |
| KR | 20110107120 A | 9/2011 |
| WO | 2018009363 A1 | 1/2018 |
| WO | 2020106884 A1 | 5/2020 |
| WO | 2021016354 A1 | 1/2021 |

OTHER PUBLICATIONS

Japanese Patent Application No. 2022-543419, Office Action dated Aug. 15, 2023, 8 pages.
European Patent Application No. 20916180.1, Extended European Search Report dated Feb. 12, 2024, 13 pages.
Japanese Office Action dated May 14, 2024 for Application No. 2022-543419.

* cited by examiner

US 12,044,963 B2

HIGH REFRACTIVE INDEX IMPRINT COMPOSITIONS AND MATERIALS AND PROCESSES FOR MAKING THE SAME

CROSS-REFERENCE TO RELATED APPLICATIONS

This application claims benefit to U.S. Prov. Appl. No. 62/967,311, filed on Jan. 29, 2020, and U.S. Prov. Appl. No. 62/964,408, filed on Jan. 22, 2020, which are herein incorporated by reference.

BACKGROUND

Field

Embodiments of the present disclosure generally relate to microelectronic processing, and more specifically to imprint compositions and materials and related processes useful for nanoimprint lithography (NIL).

Description of the Related Art

Nano and micro-patterning of nanoparticle imprint provides opportunities for developing nanomaterial-based electronics, energy devices, sensors, and other types of devices with nanometer scale resolution. The imprint materials currently available contain either organic (high index polymers) or inorganic-organic hybrid materials (sol-gel). The majority of the imprint materials have low refractive index (<1.7), along with multiple problems associated with optical transparency in visible region, optical resolution, processability, high shrinkage of imprinted features and cost effectiveness.

Therefore, improved imprint compositions and materials and related processes are needed.

SUMMARY

Embodiments of the present disclosure generally relate to imprint compositions and materials and related processes useful for nanoimprint lithography (NIL). In one or more embodiments, an imprint composition contains one or more types of nanoparticles, one or more solvents, one or more surface ligands, one or more additives, and one or more acrylates.

In some embodiments, the imprint composition contains about 0.5 weight percent (wt %) to about 40 wt % of the nanoparticles, about 50 wt % to about 90 wt % of the solvent, about 5 wt % to about 40 wt % of the surface ligand, about 0.01 wt % to about 5 wt % of the additive, and about 0.1 wt % to about 10 wt % of the acrylate. In some examples, each nanoparticle is a bare particle without a coating or shell. In other examples, each nanoparticle contains a core and one or more shells. For example, the core can contain titanium oxide, niobium oxide, or zirconium oxide, while the shell can contain silicon oxide, zirconium oxide, niobium oxide, or any combination thereof. The core and the shell can include the same material or different materials.

In other embodiments, a method of preparing an imprinted surface includes disposing, coating, or otherwise placing an imprint composition on one or more substrates, contacting the imprint composition with a stamp having a pattern, converting the imprint composition to an imprint material, and removing the stamp from the imprint material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Figure 1A:
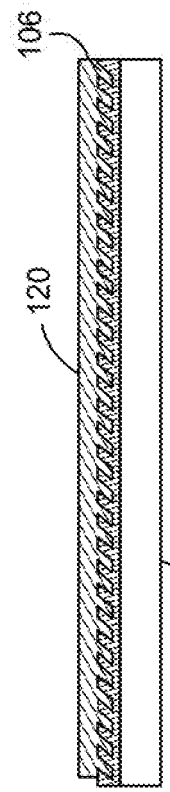
FIGS. 1A-1F depict cross-sectional views of a workpiece being processed through multiple operations while preparing a nanoimprint film containing nanoparticles, according to one or more embodiments described and discussed herein.

Embodiments of the present disclosure generally relate to imprint compositions and imprint materials useful for nanoimprint lithography (NIL). The imprint composition can be converted to the imprint material by applying heat and/or one or types of radiation, such as light or microwave. In one or more embodiments, the imprint composition contains one or more types of nanoparticles, one or more solvents, one or more surface ligands, one or more additives, and one or more acrylates.

Each nanoparticle (NP) can be a single particle or bare particle or can be a coated particle, such as an NP containing one or more shells disposed around a core. In some examples, the nanoparticles can contain one or more types of surface ligands coupled to the outer surface of the particle (e.g., ligated NPs or stabilized NPs). The nanoparticles can have one or more different shapes or geometries, such as spherical, oval, rod, cubical, wire, cylindrical, rectangular, or combinations thereof.

The nanoparticle or the core can have a size or a diameter of about 2 nm, about 5 nm, about 8 nm, about 10 nm, about 12 nm, about 15 nm, about 20 nm, about 25 nm, about 30 nm, or about 35 nm to about 40 nm, about 50 nm, about 60 nm, about 80 nm, about 100 nm, about 150 nm, about 200 nm, about 250 nm, about 300 nm, about 400 nm, about 500 nm, or larger. For example, the nanoparticle or the core can have a size or a diameter of about 2 nm to about 500 nm, about 2 nm to about 300 nm, about 2 nm to about 200 nm, about 2 nm to about 150 nm, about 2 nm to about 100 nm, about 2 nm to about 80 nm, about 2 nm to about 60 nm, about 2 nm to about 50 nm, about 2 nm to about 40 nm, about 2 nm to about 30 nm, about 2 nm to about 20 nm, about 2 nm to about 15 nm, about 2 nm to about 10 nm, about 10 nm to about 500 nm, about 10 nm to about 300 nm, about 10 nm to about 200 nm, about 10 nm to about 150 nm, about 10 nm to about 100 nm, about 10 nm to about 80 nm, about 10 nm to about 60 nm, about 10 nm to about 50 nm, about 10 nm to about 40 nm, about 10 nm to about 30 nm, about 10 nm to about 20 nm, about 10 nm to about 15 nm, about 50 nm to about 500 nm, about 50 nm to about 300 nm, about 50 nm to about 200 nm, about 50 nm to about 150 nm, about 50 nm to about 100 nm, about 50 nm to about 80 nm, or about 50 nm to about 60 nm.

The nanoparticle can be or contain one or more metal oxides, non-metal oxides, and/or diamond materials. The nanoparticle can contain niobium oxide, titanium oxide, zirconium oxide, hafnium oxide, tantalum oxide, silicon oxide, diamond, or any combination thereof. In some embodiments, if the nanoparticle has one or more shells disposed around the core, the core and shell can be the same material or different materials. The core can contain one or more inorganic materials and the shell can contain one or more organic materials and/or one or more inorganic materials. In one or more embodiments, the core can contain titanium oxide, niobium oxide, or zirconium oxide, while the shell can contain silicon oxide, zirconium oxide, niobium oxide, or any combination thereof. Typically, the core and the shell contain different materials. In one or more examples, the core contains titanium oxide and the shell contains silicon oxide, zirconium oxide, niobium oxide, or any combination thereof. In other examples, the core contains niobium oxide and the shell contains silicon oxide, zirconium oxide, or any combination thereof. In some examples, the core contains zirconium oxide and the shell contains silicon oxide.

The core has a diameter of about 2 nm, about 3 nm, about 5 nm, about 8 nm, about 10 nm, about 15 nm, about 20 nm, about 30 nm or about 40 nm to about 50 nm, about 65 nm, about 80 nm, about 100 nm, about 150 nm, about 200 nm, about 250 nm, about 300 nm, about 400 nm, about 500 nm, or greater. For example, the core has a diameter of about 2 nm to about 500 nm, about 5 nm to about 500 nm, about 10 nm to about 500 nm, about 20 nm to about 500 nm, about 50 nm to about 500 nm, about 100 nm to about 500 nm, about 150 nm to about 500 nm, about 200 nm to about 500 nm, about 300 nm to about 500 nm, about 2 nm to about 200 nm, about 5 nm to about 200 nm, about 10 nm to about 200 nm, about 20 nm to about 200 nm, about 50 nm to about 200 nm, about 100 nm to about 200 nm, about 150 nm to about 200 nm, about 2 nm to about 100 nm, about 5 nm to about 100 nm, about 10 nm to about 100 nm, about 20 nm to about 100 nm, about 50 nm to about 100 nm, or about 80 nm to about 100 nm.

The shell has a thickness of about 0.1 nm, about 0.2 nm, about 0.5 nm, about 0.8 nm, about 1 nm, about 1.5 nm, about 2 nm, about 5 nm, about 8 nm, or about 10 nm to about 12 nm, about 15 nm, about 18 nm, about 20 nm, about 30 nm, about 40 nm, about 50 nm, about 60 nm, about 80 nm, about 100 nm, about 150 nm, or greater. For example, the shell has a thickness of about 0.1 nm to about 150 nm, about 0.1 nm to about 100 nm, about 0.1 nm to about 80 nm, about 0.1 nm to about 60 nm, about 0.1 nm to about 50 nm, about 0.1 nm to about 40 nm, about 0.1 nm to about 30 nm, about 0.1 nm to about 20 nm, about 0.1 nm to about 15 nm, about 0.1 nm to about 10 nm, about 0.1 nm to about 5 nm, about 0.1 nm to about 1 nm, about 0.5 nm to about 100 nm, about 0.5 nm to about 80 nm, about 0.5 nm to about 60 nm, about 0.5 nm to about 50 nm, about 0.5 nm to about 40 nm, about 0.5 nm to about 20 nm, about 0.5 nm to about 15 nm, about 0.5 nm to about 10 nm, about 0.5 nm to about 5 nm, about 0.5 nm to about 1 nm, about 1 nm to about 150 nm, about 1 nm to about 100 nm, about 1 nm to about 80 nm, about 1 nm to about 60 nm, about 1 nm to about 50 nm, about 1 nm to about 40 nm, about 1 nm to about 30 nm, about 1 nm to about 20 nm, about 1 nm to about 15 nm, about 1 nm to about 5 nm, or about 1 nm to about 3 nm.

In some examples, the core has a diameter of about 2 nm to about 500 nm and the shell has a thickness of about 0.1 nm to about 100 nm. In other examples, the core has a diameter of about 5 nm to about 200 nm and the shell has a thickness of about 0.5 nm to about 60 nm. In some examples, the core has a diameter of about 10 nm to about 100 nm and the shell has a thickness of about 1 nm to about 15 nm.

In one or more embodiments, the imprint composition contains the nanoparticles at a concentration of about 0.1 weight percent (wt %), about 0.5 wt %, about 1 wt %, about 2 wt %, about 3 wt %, about 5 wt %, about 6 wt %, about 8 wt %, or about 10 wt % to about 12 wt %, about 15 wt %, about 18 wt %, about 20 wt %, about 22 wt %, about 24 wt %, about 25 wt %, about 28 wt %, about 30 wt %, about 32 wt %, about 35 wt %, about 38 wt %, or about 40 wt %. For example, the imprint composition contains the nanoparticles at a concentration of about 0.1 wt % to about 40 wt %, about 0.5 wt % to about 40 wt %, about 0.5 wt % to about 35 wt %, about 0.5 wt % to about 32 wt %, about 0.5 wt % to about 30 wt %, about 0.5 wt % to about 28 wt %, about 0.5 wt % to about 25 wt %, about 0.5 wt % to about 22 wt %, about 0.5 wt % to about 20 wt %, about 0.5 wt % to about 18 wt %, about 0.5 wt % to about 15 wt %, about 0.5 wt % to about 12 wt %, about 0.5 wt % to about 10 wt %, about 0.5 wt % to about 8 wt %, about 0.5 wt % to about 6 wt %, about 0.5 wt % to about 5 wt %, about 0.5 wt % to about 4 wt %, about 0.5 wt % to about 3 wt %, about 0.5 wt % to about 2 wt %, about 0.5 wt % to about 1.5 wt %, about 0.5 wt % to about 1 wt %, about 2 wt % to about 40 wt %, about 2 wt % to about 35 wt %, about 2 wt % to about 32 wt %, about 2 wt % to about 30 wt %, about 2 wt % to about 28 wt %, about 2 wt % to about 25 wt %, about 2 wt % to about 22 wt %, about 2 wt % to about 20 wt %, about 2 wt % to about 18 wt %, about 2 wt % to about 15 wt %, about 2 wt % to about 12 wt %, about 2 wt % to about 10 wt %, about 2 wt % to about 8 wt %, about 2 wt % to about 6 wt %, about 2 wt % to about 5 wt %, about 2 wt % to about 4 wt %, about 2 wt % to about 3 wt %, about 5 wt % to about 40 wt %, about 5 wt % to about 35 wt %, about 5 wt % to about 32 wt %, about 5 wt % to about 30 wt %, about 5 wt % to about 28 wt %, about 5 wt % to about 25 wt %, about 5 wt % to about 22 wt %, about 5 wt % to about 20 wt %, about 5 wt % to about 18 wt %, about 5 wt % to about 15 wt %, about 5 wt % to about 12 wt %, about 5 wt % to about 10 wt %, about 5 wt % to about 8 wt %, or about 5 wt % to about 6 wt %.

In other embodiments, the imprint composition contains the nanoparticles at a concentration of about 40 wt %, about 50 wt %, about 55 wt %, about 60 wt %, about 62 wt %, or about 65 wt % to about 68 wt %, about 70 wt %, about 75 wt %, about 80 wt %, about 85 wt %, about 88 wt %, about 90 wt %, about 92 wt %, about 93 wt %, about 94 wt %, about 95 wt %, about 96 wt %, about 97 wt %, about 98 wt %, or more. For example, the imprint composition contains the nanoparticles at a concentration of about 40 wt % to about 98 wt %, about 50 wt % to about 95 wt %, about 50 wt % to about 90 wt %, about 50 wt % to about 80 wt %, about 50 wt % to about 75 wt %, about 50 wt % to about 70 wt %, about 50 wt % to about 65 wt %, about 50 wt % to about 60 wt %, about 50 wt % to about 55 wt %, about 60 wt % to about 95 wt %, about 60 wt % to about 90 wt %, about 60 wt % to about 80 wt %, about 60 wt % to about 75 wt %, about 60 wt % to about 70 wt %, about 60 wt % to about 65 wt %, about 70 wt % to about 95 wt %, about 70 wt % to about 90 wt %, about 70 wt % to about 80 wt %, or about 70 wt % to about 75 wt %.

The surface ligand can be or include one or more carboxylic acids, one or more esters, one or more amines, one or more alcohols, one or more silanes, salts thereof, complexes thereof, or any combination thereof. Exemplary surface ligands can be or include oleic acid, stearic acid, propionic acid, benzoic acid, palmitic acid, myristic acid, methylamine, oleylamine, butylamine, benzyl alcohol, oleyl alcohol, butanol, octanol, dodecanol, octyltrimethoxy silane, octyltriethoxy silane, octenyltrimethoxy silane, octenyltriethoxy silane, 3-(trimethoxysilyl)propyl methacrylate, propyltriethoxy silane, salts thereof, esters thereof, complexes thereof, or any combination thereof. In some examples, the surface ligand is at a concentration of about 8 wt % to about 50 wt %, based on the weight of the nanoparticles.

The imprint composition contains the surface ligand at a concentration of about 0.5 wt %, about 1 wt %, about 2 wt %, about 3 wt %, about 5 wt %, about 7 wt %, about 8 wt %, or about 10 wt % to about 12 wt %, about 15 wt %, about 18 wt %, about 20 wt %, about 25 wt %, about 30 wt %, about 35 wt %, about 40 wt %, about 45 wt %, or about 50 wt %. For example, the imprint composition contains the surface ligand at a concentration of about 0.5 wt % to about 50 wt %, about 1 wt % to about 50 wt %, about 3 wt % to about 50 wt %, about 5 wt % to about 50 wt %, about 5 wt % to about 40 wt %, about 5 wt % to about 35 wt %, about 5 wt % to about 30 wt %, about 5 wt % to about 25 wt %, about 5 wt % to about 20 wt %, about 5 wt % to about 15 wt %, about 5 wt % to about 10 wt %, about 10 wt % to about 50 wt %, about 10 wt % to about 40 wt %, about 10 wt % to about 35 wt %, about 10 wt % to about 30 wt %, about 10 wt % to about 25 wt %, about 10 wt % to about 20 wt %, about 10 wt % to about 15 wt %, about 15 wt % to about 50 wt %, about 15 wt % to about 40 wt %, about 15 wt % to about 35 wt %, about 15 wt % to about 30 wt %, about 15 wt % to about 25 wt %, or about 15 wt % to about 20 wt %.

The solvent can be or include one or more nanoparticle dispersion solvents, one or more imprinting solvents, other types of solvents, or any combination thereof. The nanoparticle dispersion solvent can be or include one or more glycol ethers, alcohols, acetates, esters thereof, salts thereof, derivatives thereof, or any combination thereof. In some examples, the nanoparticle dispersion solvent can be or include one or more p-series glycol ethers, one or more e-series glycol ethers, or any combination thereof. In one or more examples, the nanoparticle dispersion solvent contains propylene glycol methyl ether acetate (PGMEA). The imprinting solvent can be or include one or more alcohols, one or more esters, salts thereof, or any combination thereof. In one or more examples, the imprinting solvent contains ethyl lactate.

In one or more embodiments, the imprint composition contains one or more solvents at a concentration of about 50 wt %, about 55 wt %, about 60 wt %, about 62 wt %, about 65 wt %, about 68 wt %, about 70 wt %, about 72 wt %, about 75 wt %, or about 80 wt % to about 83 wt %, about 85 wt %, about 87 wt %, about 88 wt %, about 90 wt %, about 92 wt %, about 94 wt %, about 95 wt %, about 97 wt %, or about 98 wt %. For example, the imprint composition contains one or more solvents at a concentration of about 50 wt % to about 98 wt %, about 60 wt % to about 98 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 80 wt % to about 98 wt %, about 80 wt % to about 95 wt %, about 80 wt % to about 90 wt %, about 80 wt % to about 88 wt %, about 80 wt % to about 85 wt %, about 80 wt % to about 83 wt %, or about 80 wt % to about 82 wt %.

In some embodiments, the imprint composition contains the nanoparticle dispersion solvent at a concentration of about 0.5 wt %, about 0.8 wt %, about 1 wt %, about 1.5 wt %, about 2 wt %, about 2.5 wt %, about 3 wt %, about 3.5 wt %, about 4 wt %, about 5 wt %, or about 6 wt % to about 7 wt %, about 8 wt %, about 10 wt %, about 12 wt %, about 14 wt %, about 15 wt %, about 18 wt %, about 20 wt %, or about 25 wt %. For example, the imprint composition contains the nanoparticle dispersion solvent at a concentration of about 0.5 wt % to about 20 wt %, about 1 wt % to about 20 wt %, about 1 wt % to about 18 wt %, about 1 wt % to about 15 wt %, about 1 wt % to about 13 wt %, about 1 wt % to about 12 wt %, about 1 wt % to about 11 wt %, about 1 wt % to about 10 wt %, about 1 wt % to about 8 wt %, about 1 wt % to about 7 wt %, about 1 wt % to about 6 wt %, about 1 wt % to about 5 wt %, about 1 wt % to about 4 wt %, about 1 wt % to about 3 wt %, about 5 wt % to about 20 wt %, about 5 wt % to about 18 wt %, about 5 wt % to about 15 wt %, about 5 wt % to about 13 wt %, about 5 wt % to about 12 wt %, about 5 wt % to about 11 wt %, about 5 wt % to about 10 wt %, about 5 wt % to about 8 wt %, about 5 wt % to about 7 wt %, about 5 wt % to about 6 wt %, about 8 wt % to about 20 wt %, about 8 wt % to about 18 wt %, about 8 wt % to about 15 wt %, about 8 wt % to about 13 wt %, about 8 wt % to about 12 wt %, about 8 wt % to about 11 wt %, about 8 wt % to about 10 wt %, or about 8 wt % to about 9 wt %.

In other embodiments, the imprint composition contains the imprinting solvent at a concentration of about 50 wt %, about 55 wt %, about 60 wt %, about 62 wt %, about 65 wt %, about 68 wt %, or about 70 wt % to about 72 wt %, about 75 wt %, about 78 wt %, about 80 wt %, about 82 wt %, about 83 wt %, about 85 wt %, about 87 wt %, about 88 wt %, about 90 wt %, or about 95 wt %. For example, the imprint composition contains the imprinting solvent at a concentration of about 50 wt % to about 95 wt %, about 60 wt % to about 95 wt %, about 60 wt % to about 90 wt %, about 60 wt % to about 88 wt %, about 60 wt % to about 85 wt %, about 60 wt % to about 83 wt %, about 60 wt % to about 80 wt %, about 60 wt % to about 78 wt %, about 60 wt % to about 75 wt %, about 60 wt % to about 72 wt %, about 60 wt % to about 70 wt %, about 60 wt % to about 68 wt %, about 60 wt % to about 65 wt %, about 60 wt % to about 63 wt %, about 70 wt % to about 98 wt %, about 70 wt % to about 95 wt %, about 70 wt % to about 90 wt %, about 70 wt % to about 88 wt %, about 70 wt % to about 85 wt %, about 70 wt % to about 83 wt %, about 70 wt % to about 80 wt %, about 70 wt % to about 78 wt %, about 70 wt % to about 75 wt %, about 70 wt % to about 72 wt %, about 75 wt % to about 98 wt %, about 75 wt % to about 95 wt %, about 75 wt % to about 90 wt %, about 75 wt % to about 88 wt %, about 75 wt % to about 85 wt %, about 75 wt % to about 83 wt %, about 75 wt % to about 80 wt %, or about 75 wt % to about 78 wt %.

The additive can be or include one or more perfluoroalkyl ethers, one or more polyglycols, one or more fatty acids, one or more silanes, one or more siloxanes, or any combination thereof. Exemplary additives can be or include fluorosurfactant, fluoro-additive, and/or fluorocarbon (e.g., CAPSTONE® FS-66 or FS-68 fluorosurfactant, available from DuPont), glycolic acid ethoxylate oleyl ether, polyethylene glycol, polypropylene glycol, lauric acid, myristic acid, stearic acid, palmitic acid, dimethyldiethoxysilane, polydimethylsiloxane, polydiphenylsiloxane, hexamethylcyclotrisiloxane, octamethylcyclotetrasiloxane, silanol terminated polydimethylsiloxane, vinyl terminated polydimethylsiloxane, 1,2-propanediol, salts thereof, esters thereof, complexes thereof, or any combination thereof. The additive can be or include one or more diols, one or more alcohols with three or more alcohol groups, or any combination thereof. In one or more examples, the additive contains 1,2-propanediol. In some examples, the additive is at a concentration of about 0.01 wt % to about 2.5 wt %, based on the weight of the nanoparticles.

The imprint composition contains the additive at a concentration of about 0.01 wt %, about 0.05 wt %, about 0.1 wt %, about 0.2 wt %, about 0.3 wt %, about 0.5 wt %, about 0.8 wt %, or about 1 wt % to about 1.2 wt %, about 1.5 wt %, about 1.8 wt %, about 2 wt %, about 2.5 wt %, about 3 wt %, about 3.5 wt %, about 4 wt %, about 5 wt %, about 6 wt %, about 8 wt %, or about 10 wt %. For example, the imprint composition contains the additive at a concentration of about 0.01 wt % to about 10 wt %, about 0.01 wt % to about 8 wt %, about 0.01 wt % to about 5 wt %, about 0.01 wt % to about 4 wt %, about 0.01 wt % to about 3 wt %, about 0.01 wt % to about 2 wt %, about 0.01 wt % to about 1 wt %, about 0.01 wt % to about 0.5 wt %, about 0.01 wt % to about 0.1 wt %, about 0.01 wt % to about 0.05 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 10 wt %, about 1 wt % to about 8 wt %, about 1 wt % to about 5 wt %, about 1 wt % to about 4 wt %, about 1 wt % to about 3 wt %, about 1 wt % to about 2 wt %, or about 1 wt % to about 1.5 wt %.

The acrylate can be or include one or more methacrylates, one or more ethylacrylates, one or more propylacrylates, one or more butylacrylates, one or more mono-functional acrylates, one or more di-functional acrylates, one or more tri-functional acrylates, other multi-functional acrylates, or any combination thereof. Exemplary acrylates can be or include 3-(trimethoxysilyl)propyl methacrylate (3-MPS), 3-(trimethoxysilyl)propyl acrylate, di(ethylene glycol) methyl ether methacrylate, ethylene glycol methyl ether methacrylate, 2-ethylhexyl methacrylate, ethyl methacrylate, hexyl methacrylate, methacrylic acid, vinyl methacrylate, monomers thereof, polymers thereof, salts thereof, complexes thereof, or any combination. In some examples, the acrylate is at a concentration of about 0.05 wt % to about 10 wt %, based on the weight of the nanoparticles.

The imprint composition contains the acrylate at a concentration of about 0.1 wt %, about 0.2 wt %, about 0.3 wt %, about 0.5 wt %, about 0.8 wt %, about 1 wt % to about 1.2 wt %, about 1.5 wt %, about 1.8 wt %, or about 2 wt %, about 2.2 wt %, about 2.3 wt %, about 2.5 wt %, about 2.8 wt %, about 3 wt %, about 3.2 wt %, about 3.5 wt %, about 3.8 wt %, about 4 wt %, about 5 wt %, about 6 wt %, about 8 wt %, about 10 wt %, about 12 wt %, about 15 wt %, about 18 wt %, or about 20 wt %. For example, the imprint composition contains the acrylate at a concentration of about 0.1 wt % to about 20 wt %, about 0.1 wt % to about 15 wt %, about 0.1 wt % to about 10 wt %, about 0.1 wt % to about 8 wt %, about 0.1 wt % to about 5 wt %, about 0.1 wt % to about 4 wt %, about 0.1 wt % to about 3 wt %, about 0.1 wt % to about 2 wt %, about 0.1 wt % to about 1 wt %, about 0.1 wt % to about 0.5 wt %, about 1 wt % to about 20 wt %, about 1 wt % to about 15 wt %, about 1 wt % to about 10 wt %, about 1 wt % to about 8 wt %, about 1 wt % to about 5 wt %, about 1 wt % to about 4 wt %, about 1 wt % to about 3.5 wt %, about 1 wt % to about 3.2 wt %, about 1 wt % to about 3 wt %, about 1 wt % to about 2.8 wt %, about 1 wt % to about 2.5 wt %, about 1 wt % to about 2.3 wt %, about 1 wt % to about 2.2 wt %, about 1 wt % to about 2 wt %, about 1 wt % to about 1.8 wt %, about 1 wt % to about 1.5 wt %, about 1.8 wt % to about 20 wt %, about 1.8 wt % to about 15 wt %, about 1.8 wt % to about 10 wt %, about 1.8 wt % to about 8 wt %, about 1.8 wt % to about 5 wt %, about 1.8 wt % to about 4 wt %, about 1.8 wt % to about 3.5 wt %, about 1.8 wt % to about 3.2 wt %, about 1.8 wt % to about 3 wt %, about 1.8 wt % to about 2.8 wt %, about 1.8 wt % to about 2.5 wt %, about 1.8 wt % to about 2.3 wt %, about 1.8 wt % to about 2.2 wt %, or about 1.8 wt % to about 2 wt %.

In one or more examples, the imprint composition contains about 0.5 wt % to about 40 wt % of the nanoparticles, about 50 wt % to about 90 wt % of one or more solvents, about 5 wt % to about 40 wt % of the surface ligand, about 0.01 wt % to about 5 wt % of the additive, and about 0.1 wt % to about 10 wt % of the acrylate. In other examples, the imprint composition contains about 1 wt % to about 25 wt % of the nanoparticles, about 60 wt % to about 85 wt % of one or more solvents, about 6 wt % to about 35 wt % of the surface ligand, about 0.05 wt % to about 3 wt % of the additive, and about 0.3 wt % to about 8 wt % of the acrylate. In some examples, the imprint composition contains about 5 wt % to about 20 wt % of the nanoparticles, about 65 wt % to about 80 wt % of one or more solvents, about 7 wt % to about 31 wt % of the surface ligand, about 0.09 wt % to about 1.5 wt % of the additive, and about 0.5 wt % to about 6 wt % of the acrylate.

The imprint composition can have a viscosity of about 1 cP, about 2 cP, about 3 cP, about 5 cP, about 8 cP, or about 10 cP to about 12 cP, about 15 cP, about 20 cP, about 25 cP, about 30 cP, about 40 cP, about 50 cP, or about 70 cP, as measured at a temperature of 23° C. For example, the imprint composition can have a viscosity of about 1 cP to about 70 cP, about 1 cP to about 50 cP, about 1 cP to about 40 cP, about 1 cP to about 30 cP, about 1 cP to about 20 cP, about 1 cP to about 10 cP, about 1 cP to about 5 cP, about 10 cP to about 70 cP, about 10 cP to about 50 cP, about 10 cP to about 40 cP, about 10 cP to about 30 cP, about 10 cP to about 20 cP, about 20 cP to about 70 cP, about 20 cP to about 50 cP, about 20 cP to about 40 cP, about 20 cP to about 30 cP, or about 20 cP to about 25 cP, as measured at a temperature of 23° C.

Methods for Preparing an Imprinted Surface

In one or more embodiments, methods for preparing an imprinted surface, such as an NIL film, are provided. The imprinted surface is one or more exposed surfaces of the nanoimprint film described and discussed herein. The method includes disposing, coating, or otherwise placing an imprint composition on one or more substrates, contacting the imprint composition with a stamp having a pattern, converting the imprint composition to an imprint material (e.g., a nanoimprint film), and removing the stamp from the imprint material. In some examples, the substrate (e.g., wafer) can be or include glass, quartz, silicon oxide, such as a glass substrate or a glass wafer. In other examples, the substrate can be or include silicon, silicon-germanium, plastic, and/or other materials. The imprint composition can have a refractive index of about 1.7 to about 2.0. The pattern on the stamp and transferred to the imprinted surface can be a 1-dimension pattern, a 2-dimension pattern, or a 3-dimension pattern.

Figure 1B:
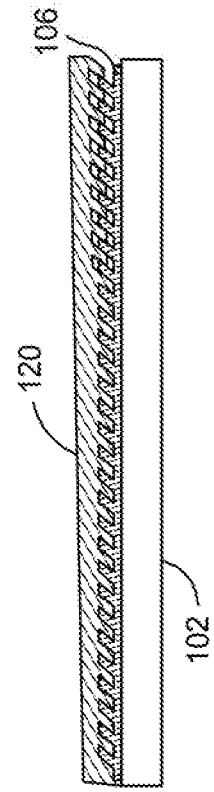
Figure 1C:
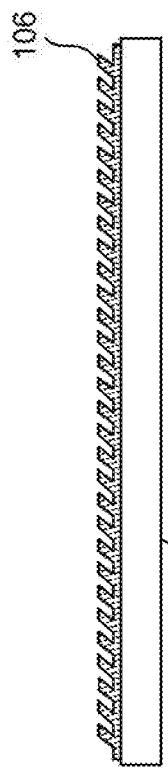
Figure 1D:
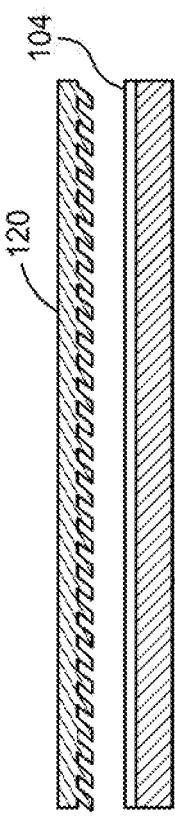
Figure 1E:
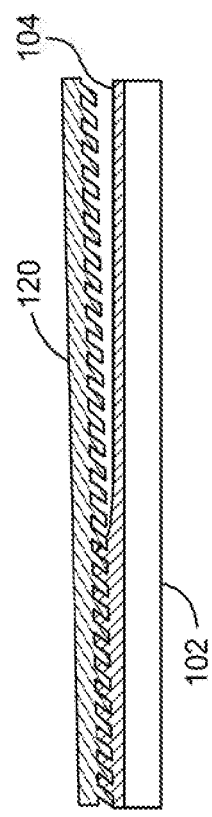
Figure 1F:
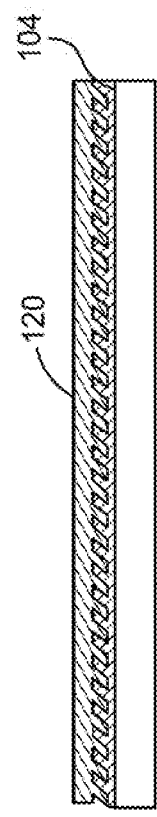

FIGS. 1A-1F depict cross-sectional views of a workpiece being processed through multiple operations while preparing a nanoimprint film containing nanoparticles, such as the nanoimprint films according to one or more embodiments described and discussed herein. The nanoimprint film is formed on the substrate by an imprint process. The imprint process includes disposing an imprint composition 104 containing nanoparticles on a substrate 102 and aligning a stamp 120 above or adjacent to the imprint composition 104 (FIG. 1A). The imprint composition 104 is impressed or otherwise contacted with the stamp 120 having a pattern (FIGS. 1B-1C). The imprint composition 104 is converted to a nanoimprint film 106 (FIG. 1D). In some examples, a curing process with heat and/or radiation (UV light) is used to convert the imprint composition 104 to the nanoimprint film 106. The stamp 120 is removed from the nanoimprint film 106, which is left disposed on the substrate 102 (FIGS. 1E-1F).

In some examples, the imprint composition is disposed on the substrate by spin coating, drop casting, blade coating, and/or other coating processes. The imprint composition is disposed on the substrate as a film or a layer having a predetermined thickness. The thickness of the imprint composition is about 50 nm, about 80 nm, about 100 nm, about 120 nm, about 150 nm, or about 200 nm to about 250 nm, about 300 nm, about 400 nm, about 500 nm, about 600 nm, about 800 nm, about 1,000 nm, about 1,200 nm, or thicker. For example, the thickness of the imprint composition is about 50 nm to about 1,000 nm, about 100 nm to about 1,000 nm, about 200 nm to about 1,000 nm, about 400 nm to about 1,000 nm, about 500 nm to about 1,000 nm, about 600 nm to about 1,000 nm, about 800 nm to about 1,000 nm, about 50 nm to about 600 nm, about 100 nm to about 600 nm, about 200 nm to about 600 nm, about 400 nm to about 600 nm, about 500 nm to about 600 nm, about 50 nm to about 400 nm, about 100 nm to about 400 nm, about 200 nm to about 400 nm, or about 300 nm to about 400 nm.

The imprint composition is converted to the imprint material by exposing the imprint composition to heat, ultraviolet light, infrared light, visible light, microwave radiation, and/or any combination thereof. In one or more examples, when converting the imprint composition to the imprint material, the imprint composition is exposed to a light source having a wavelength of about 300 nm to about 365 nm. In other examples, when converting the imprint composition to the imprint material, the imprint composition is exposed to heat and maintained at a temperature of about 30° C. to about 100° C. for a time period of about 30 seconds to about 1 hour. In some examples, the imprint composition is exposed to heat and maintained at a temperature of about 50° C. to about 60° C. for a time period of about 1 minute to about 15 minutes.

In one or more embodiments, the one or more acrylates in the imprint composition can be polymerized and/or oligomerized while producing (e.g., curing or otherwise converting) the imprint material.

Below are several prophetic examples of imprint compositions which can be produced by embodiments described and discussed herein.

| Generic Formulations | |
|---|---|
| Component | Concentration (wt %) |
| NPs | 0.5%-25% |
| surface ligand | 0.5%-20% |
| dispersion solvent | 5%-20% |

| Generic Formulations (continued) | |
|---|---|
| Component | Concentration (wt %) |
| acrylate | 0.5%-10% |
| imprinting solvent | 60%-80% |
| diol additive | 0.5%-8% |
| surfactant additive | 0.01%-1% |
| Total | 100 |

| Prophetic Example 1 | | |
|---|---|---|
| Component | Concentration (wt %) | Amount (g) |
| NPs (TiO$_2$) | 10% | 10 |
| surface ligand | 2% | 2 |
| PGMEA | 12% | 12 |
| 3-MPS | 2.3% | 2.3 |
| ethyl lactate | 71% | 71 |
| 1,2-propanediol | 3% | 3 |
| surfactant (FS66) | 0.15% | 0.15 |
| Total | 100 | 100 |

| Prophetic Example 2 | | |
|---|---|---|
| Component | Concentration (wt %) | Amount (g) |
| NPs (TiO$_2$) | 6.5% | 6.5 |
| surface ligand | 1.5% | 1.5 |
| PGMEA | 8% | 8 |
| 3-MPS | 2.3% | 2.3 |
| ethyl lactate | 79% | 79 |
| 1,2-propanediol | 2.55% | 2.55 |
| surfactant (FS66) | 0.15% | 0.15 |
| Total | 100 | 100 |

In one or more embodiments described and discussed herein, the imprint material contains, or includes inorganic oxide nanoparticles (about 1 wt % to about 95 wt %), methacrylate or acrylate or chloro-acrylate binder (about 0.1 wt % to about 10 wt %), high boiling point components such as diols, fatty acids, amines (about 0.1 wt % to about 5 wt %), and an ether or acetate solvent (about 5 wt % to about 20 wt %) with optimal viscosity (about 1 cP to about 50 cP at about 23° C.). The imprint material exhibits high refractive index of greater than 1.7 with optical transparency of greater than 90% in the visible region at different weight percentages (about 1 wt % to about 50 wt %) and allows high resolution large area patterning with a feature shrinkage of about 1% to about 30% (in some examples, less than 1%). Nanoimprint lithography combined with high refractive index materials provides a unique route to fabricate printable devices by directly imprinting this functional material. The patterned films have the final desired optical functionality, and there is no need for additional etching steps. This approach combines the advantages of both the top-down lithography process to fabricate micro/nanostructures with high control, and of the bottom-up synthetic chemistry approach to design and tune the properties of the patterned films.

In other embodiments described and discussed herein, an inorganic nanoparticle imprint composition was prepared and has low viscosity of about 1 cP to about 50 cP (at about 23° C.), a high refractive index, and is optically transparent and easy processable. The inorganic imprint composition can include or contain spherical or cubic or oval shape nanoparticles, may or may not be core-shell, (about 2 to about 20 nm) in a high boiling point ether or acetate-based solvent at about 1 wt % to about 80 wt %. The imprint composition can include or contain one or more of: a methacrylate or acrylate binder (about 0.1 wt % to about 10 wt %), fatty acid (about 0.05 wt % to about 5 wt %), an amine (about 0.05 wt % to about 5 wt %), a PEG based monomer (about 0.1 wt % to about 15 wt %), and a perfluoro- or siloxane dispersant (about 0.05 wt % to about 5 wt %), which acts as a surfactant. The final imprint composition remains optically transparent at room temperature (about 23° C.) for more than 6 months and can be used with or without filtration.

In some embodiments, a scalable, solvent-assisted soft NIL method is used to generate large areas of nanopatterned features and structures. This form of NIL uses polydimethylsiloxane (PDMS) or other silicone stamps, many of which can be produced from one silicon master, and each of which can be reused many times, minimizing costs. The area of imprinted structures is thus primarily limited by only the size of the original patterned master. Feature sizes of less than 100 nm can be replicated using PDMS. Briefly, the imprint composition is dispensed on the surface of a substrate either filtered or as such. The substrate is spun to produce a film with a thickness of about 100 nm to about 400 nm. The PDMS mold is placed on the surface of the spun-on film and then cured thermally at about 50° C. to about 60° C. The UV curing is done with a light source at a wavelength of about 300 nm to about 365 nm and with a power of about 10 Jcm$^{-2}$ to about 50 Jcm$^{-2}$. After curing of the imprint composition to produce an imprint material, the PDMS stamp is removed in or opposite to the direction of the grating. The released stamp is used again, and the imprint can be additionally cured by thermal and/or UV processes to densify the material.

Figure 2:
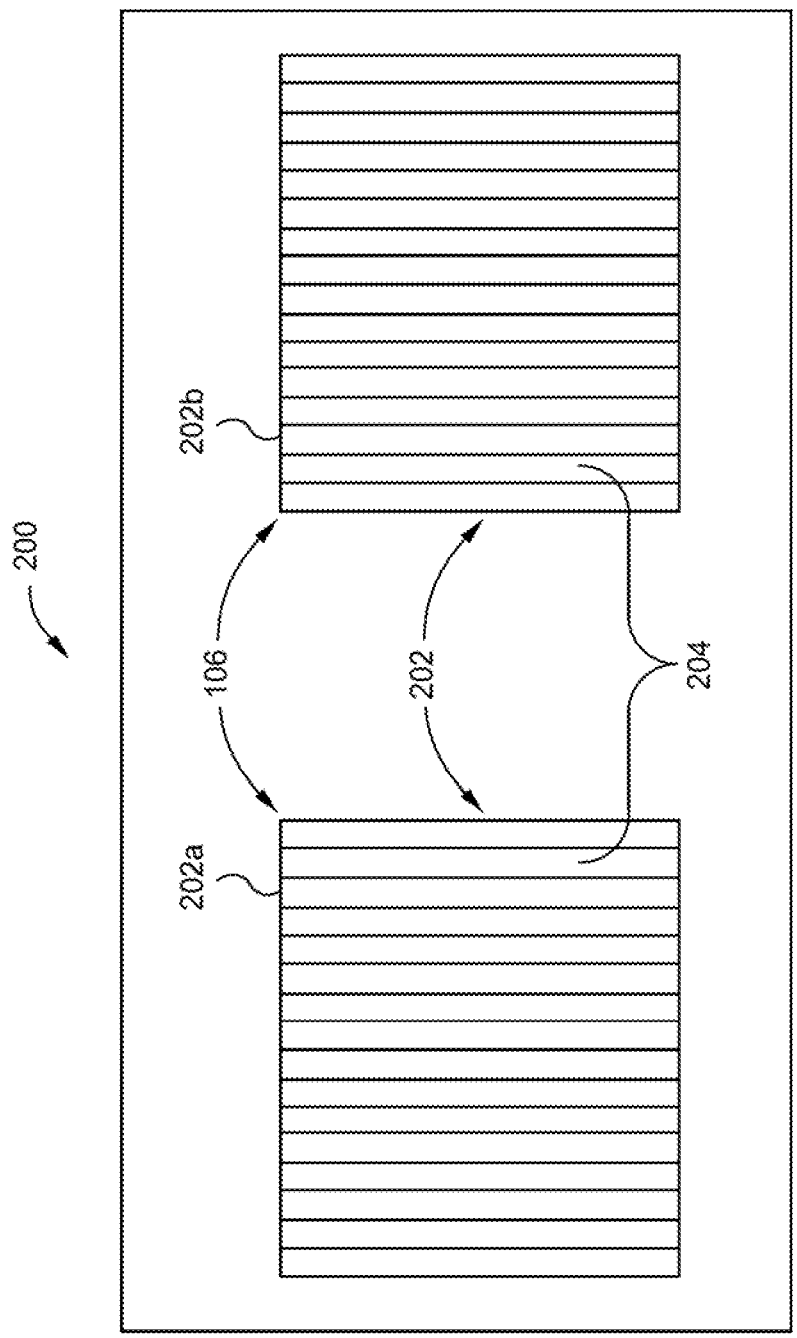
FIG. 2 depicts a front view of an optical device, according to one or more embodiments described and discussed herein.

FIG. 2 depicts a front view of an optical device 200 containing the nanoimprint film 106, as depicted in FIG. 1F, according to one or more embodiments described and discussed herein. It is to be understood that the optical device 200 described below is an exemplary optical device. In one or more embodiments, the optical device 200 is a waveguide combiner, such as an augmented reality waveguide combiner. In other embodiments, the optical device 200 is a flat optical device, such as a metasurface. The optical device 200 includes a plurality of device structures 204. The device structures 204 may be nanostructures having sub-micro dimensions, e.g., nano-sized dimensions, such as critical dimensions less than 1 µm. In one or more embodiments, regions of the device structures 204 correspond to one or more gratings 202, such as the grating areas 202a and 202b. In one or more embodiments, the optical device 200 includes a first grating area 202a and a second grating area 202b and each of the first grating area 202a and 202b each contain a plurality of device structures 204.

The depth of the gratings 202 may vary across the grating areas 202a and 202b in embodiments described herein. In some embodiments, the depth of the gratings 202 may vary smoothly over the first grating area 202a and over the second grating area 202b. In one or more examples, the depth may range from about 10 nm to about 400 nm across one of the grating areas. The grating area 202a, in some examples, can range from about 20 mm to about 50 mm on a given side. Therefore, as some examples, the angle of the change in the depth of the gratings 202 may be on the order of 0.0005 degrees.

In embodiments described herein, the device structures 204 may be created using laser ablation. Laser ablation, as used herein, is used to produce three-dimensional microstructures in the device material, or optionally to create a variable-depth structure in a sacrificial layer overlaying the device material as part of a variable-depth structure process. Using laser ablation to create the optical structures 204 allows for fewer processing operations and higher variable-depth resolution than existing methods.

Embodiments of the present disclosure further relate to any one or more of the following paragraphs 1-46:

1. An imprint composition, comprising: nanoparticles; one or more solvents; a surface ligand; an additive; and an acrylate.
2. An imprint composition, comprising: about 0.5 wt % to about 40 wt % of nanoparticles; about 50 wt % to about 90 wt % of a solvent; about 5 wt % to about 40 wt % of a surface ligand; about 0.01 wt % to about 5 wt % of an additive; and about 0.1 wt % to about 10 wt % of an acrylate, wherein each nanoparticle comprises a core and a shell, wherein the core comprises titanium oxide, niobium oxide, or zirconium oxide, wherein the shell comprises silicon oxide, zirconium oxide, niobium oxide, or any combination thereof, and wherein the core and the shell comprise different materials.
3. The imprint composition according to paragraph 1, wherein the imprint composition comprises: about 0.5 wt % to about 40 wt % of the nanoparticles; about 50 wt % to about 90 wt % of the solvent; about 5 wt % to about 40 wt % of the surface ligand; about 0.01 wt % to about 5 wt % of the additive; and about 0.1 wt % to about 10 wt % of the acrylate.
4. The imprint composition according to any one of paragraphs 1-3, wherein the imprint composition comprises: about 1 wt % to about 25 wt % of the nanoparticles; about 60 wt % to about 85 wt % of the solvent; about 6 wt % to about 35 wt % of the surface ligand; about 0.05 wt % to about 3 wt % of the additive; and about 0.3 wt % to about 8 wt % of the acrylate.
5. The imprint composition according to any one of paragraphs 1-4, wherein the imprint composition comprises: about 5 wt % to about 20 wt % of the nanoparticles; about 65 wt % to about 80 wt % of the solvent; about 7 wt % to about 31 wt % of the surface ligand; about 0.09 wt % to about 1.5 wt % of the additive; and about 0.5 wt % to about 6 wt % of the acrylate.
6. The imprint composition according to any one of paragraphs 1-5, wherein the nanoparticles have a shape selected from the group consisting of spherical, oval, rod, cubical, wire, cylindrical, rectangular, or combinations thereof.
7. The imprint composition according to any one of paragraphs 1-6, wherein the nanoparticles comprise a metal oxide or a diamond material.
8. The imprint composition according to any one of paragraphs 1-7, wherein the nanoparticles comprise niobium oxide.
9. The imprint composition according to any one of paragraphs 1-8, wherein each nanoparticle comprises a core and one or more shells.
10. The imprint composition according to paragraph 9, wherein the core comprises titanium oxide and the shell comprises silicon oxide, zirconium oxide, niobium oxide, or any combination thereof.

11. The imprint composition according to paragraph 9, wherein the core comprises niobium oxide and the shell comprises silicon oxide, zirconium oxide, or any combination thereof.
12. The imprint composition according to paragraph 9, wherein the core comprises zirconium oxide and the shell comprises silicon oxide.
13. The imprint composition according to any one of paragraphs 1-12, wherein each of the nanoparticle and/or the core independently has a diameter of about 2 nm to about 500 nm and the shell has a thickness of about 0.1 nm to about 100 nm.
14. The imprint composition according to any one of paragraphs 1-13, wherein each of the nanoparticle and/or the core independently has a diameter of about 5 nm to about 200 nm and the shell has a thickness of about 0.5 nm to about 60 nm.
15. The imprint composition according to any one of paragraphs 1-14, wherein each of the nanoparticle and/or the core independently has a diameter of about 10 nm to about 100 nm and the shell has a thickness of about 1 nm to about 15 nm.
16. The imprint composition according to any one of paragraphs 1-15, wherein the surface ligand comprises a carboxylic acid, an ester, an amine, an alcohol, a silane, salts thereof, complexes thereof, or any combination thereof.
17. The imprint composition according to any one of paragraphs 1-16, wherein the surface ligand comprises oleic acid, stearic acid, propionic acid, benzoic acid, palmitic acid, myristic acid, methylamine, oleylamine, butylamine, benzyl alcohol, oleyl alcohol, butanol, octanol, dodecanol, octyltrimethoxy silane, octyltriethoxy silane, octenyltrimethoxy silane, octenyltriethoxy silane, 3-(trimethoxysilyl)propyl methacrylate, propyltriethoxy silane, salts thereof, esters thereof, complexes thereof, or any combination thereof.
18. The imprint composition according to any one of paragraphs 1-17, wherein the surface ligand is at a concentration of about 8 wt % to about 50 wt %, based on the weight of the nanoparticles.
19. The imprint composition according to any one of paragraphs 1-18, wherein the solvent comprises a nanoparticle dispersion solvent, an imprinting solvent, or a combination thereof.
20. The imprint composition according to any one of paragraphs 1-19, wherein the solvent comprises a nanoparticle dispersion solvent, and wherein the nanoparticle dispersion solvent comprises a glycol ether, an alcohol, an acetate, esters thereof, salts thereof, derivatives thereof, or any combination thereof.
21. The imprint composition according to paragraph 20, wherein the nanoparticle dispersion solvent comprises a p-series glycol ether, an e-series glycol ether, or a combination thereof.
22. The imprint composition according to paragraph 21, wherein the nanoparticle dispersion solvent comprises propylene glycol methyl ether acetate (PGMEA).
23. The imprint composition according to paragraph 20, wherein the imprint composition comprises the nanoparticle dispersion solvent at a concentration of about 0.5 wt % to about 20 wt %.
24. The imprint composition according to any one of paragraphs 1-23, wherein the solvent comprises an imprinting solvent, and wherein the imprinting solvent comprises an alcohol, an ester, salts thereof, or combinations thereof.
25. The imprint composition according to paragraph 24, wherein the imprinting solvent comprises ethyl lactate.
26. The imprint composition according to paragraph 24 or 25, wherein the imprint composition comprises the imprinting solvent at a concentration of about 60 wt % to about 95 wt %.
27. The imprint composition according to any one of paragraphs 1-26, wherein the additive comprises a diol, an alcohol with three or more alcohol groups, or any combination thereof.
28. The imprint composition according to paragraph 27, wherein the additive comprises 1,2-propanediol.
29. The imprint composition according to any one of paragraphs 1-28, wherein the additive comprises a perfluoroalkyl ether, a polyglycol, a fatty acid, a silane, a siloxane, or any combination thereof.
30. The imprint composition according to any one of paragraphs 1-29, wherein the additive comprises fluorosurfactant, fluoroadditive, and/or fluorocarbon, glycolic acid ethoxylate oleyl ether, polyethylene glycol, polypropylene glycol, lauric acid, myristic acid, stearic acid, palmitic acid, dimethyldiethoxysilane, polydimethylsiloxane, polydiphenylsiloxane, hexamethylcyclotrisiloxane, octamethylcyclotetrasiloxane, silanol terminated polydimethylsiloxane, vinyl terminated polydimethylsiloxane, salts thereof, esters thereof, complexes thereof, or any combination thereof.
31. The imprint composition according to any one of paragraphs 1-30, wherein the additive is at a concentration of about 0.01 wt % to about 2.5 wt %, based on the weight of the nanoparticles.
32. The imprint composition according to any one of paragraphs 1-31, wherein the acrylate comprises a methacrylate, an ethylacrylate, a propylacrylate, a butylacrylate, a mono-functional acrylate, a di-functional acrylate, a tri-functional acrylate, or other multi-functional acrylates, or any combination thereof.
33. The imprint composition according to any one of paragraphs 1-32, wherein the acrylate comprises 3-(trimethoxysilyl)propyl methacrylate (3-MPS), 3-(trimethoxysilyl)propyl acrylate, di(ethylene glycol) methyl ether methacrylate, ethylene glycol methyl ether methacrylate, 2-ethylhexyl methacrylate, ethyl methacrylate, hexyl methacrylate, methacrylic acid, vinyl methacrylate, salts thereof, complexes thereof, or any combination.
34. The imprint composition according to any one of paragraphs 1-33, wherein the acrylate is at a concentration of about 0.05 wt % to about 10 wt %, based on the weight of the nanoparticles.
35. The imprint composition according to any one of paragraphs 1-34, wherein the imprint composition has a viscosity of about 1 cP to about 50 cP, as measured at a temperature of 23° C.
36. A method of preparing an imprinted surface, comprising: disposing the imprint composition according to any one of paragraphs 1-35 on a substrate; contacting the imprint composition with a stamp having a pattern; converting the imprint composition to an imprint material; and removing the stamp from the imprint material.
37. The method according to paragraph 36, wherein the imprint composition is converted to the imprint material by exposing the imprint composition to heat, ultraviolet light, infrared light, visible light, microwave radiation, or any combination thereof.
38. The method of according to paragraph 36 or 37, wherein converting the imprint composition to the imprint material further comprises exposing the imprint composition to a light source having a wavelength of about 300 nm to about 365 nm.

39. The method according to any one of paragraphs 36-38, wherein converting the imprint composition to the imprint material further comprises heating the imprint composition to a temperature of about 30° C. to about 100° C. for a time period of about 30 seconds to about 1 hour.

40. The method according to any one of paragraphs 36-39, wherein converting the imprint composition to the imprint material further comprises heating the imprint composition to a temperature of about 50° C. to about 60° C. for a time period of about 1 minute to about 15 minutes.

41. The method according to any one of paragraphs 36-40, wherein the imprint composition is disposed on the substrate by spin coating, drop casting, or blade coating.

42. The method according to any one of paragraphs 36-41, wherein the imprint composition is disposed on the substrate as a layer having a thickness of about 50 nm to about 1,000 nm.

43. The method according to any one of paragraphs 36-42, wherein the imprint composition is disposed on the substrate as a layer having a thickness of about 100 nm to about 400 nm.

44. The method according to any one of paragraphs 36-43, wherein the imprint composition has a refractive index of about 1.7 to about 2.0.

45. The method according to any one of paragraphs 36-44, wherein the pattern on the stamp is a 1-dimension pattern, a 2-dimension pattern, or a 3-dimension pattern.

46. The method according to any one of paragraphs 36-45, wherein the substrate comprises glass.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. An imprint composition, comprising:
   nanoparticles, wherein each nanoparticle comprises a core and a shell, and wherein the core comprises metal oxide and the shell comprises silicon oxide;
   one or more solvents;
   a surface ligand, wherein the surface ligand comprises oleic acid, stearic acid, propionic acid, benzoic acid, palmitic acid, myristic acid, methylamine, oleylamine, butylamine, or any combination thereof, and wherein the surface ligand is at a concentration of about 6 weight percent (wt %) to about 50 wt %, based on the weight of the nanoparticles; and
   an additive, wherein the additive comprises fluorosurfactant, fluorocarbon, glycolic acid ethoxylate oleyl ether, or any combination thereof, and wherein the additive is at a concentration of about 0.01 wt % to about 3 wt %, based on the weight of the nanoparticles; and
   an acrylate;
   wherein the imprint composition has a viscosity of 5 cP to about 50 cP, as measured at a temperature of 23° C.

2. The imprint composition of claim 1, wherein the imprint composition comprises:
   about 1 wt % to about 25 wt % of the nanoparticles;
   about 60 wt % to about 85 wt % of the solvent;
   about 6 wt % to about 35 wt % of the surface ligand;
   about 0.05 wt % to about 3 wt % of the additive; and
   about 0.3 wt % to about 8 wt % of the acrylate, based on the weight of the nanoparticles.

3. The imprint composition of claim 1, wherein the nanoparticles comprise niobium oxide or a diamond material, and wherein the nanoparticle has a diameter of about 5 nm to about 200 nm.

4. The imprint composition of claim 1, wherein the core comprises titanium oxide, niobium oxide, or zirconium oxide.

5. The imprint composition of claim 1, wherein the core has a diameter of about 2 nm to about 500 nm and the shell has a thickness of about 0.1 nm to about 100 nm.

6. The imprint composition of claim 1, wherein the surface ligand further comprises benzyl alcohol, oleyl alcohol, butanol, octanol, dodecanol, octyltrimethoxy silane, octyltriethoxy silane, octenyltrimethoxy silane, octenyltriethoxy silane, 3-(trimethoxysilyl)propyl methacrylate, propyltriethoxy silane, salts thereof, esters thereof, complexes thereof, or any combination thereof, and wherein the surface ligand is at a concentration of about 8 wt % to about 35 wt %, based on the weight of the nanoparticles.

7. The imprint composition of claim 1, wherein the solvent comprises a nanoparticle dispersion solvent, and wherein the nanoparticle dispersion solvent comprises a glycol ether, an alcohol, an acetate, esters thereof, salts thereof, derivatives thereof, or any combination thereof.

8. The imprint composition of claim 7, wherein the nanoparticle dispersion solvent comprises a p-series glycol ether, an e-series glycol ether, or a combination thereof, and wherein the imprint composition comprises the nanoparticle dispersion solvent at a concentration of about 0.5 wt % to about 20 wt %.

9. The imprint composition of claim 1, wherein the solvent comprises an imprinting solvent, wherein the imprinting solvent comprises an alcohol, an ester, salts thereof, or combinations thereof, and wherein the imprint composition comprises the imprinting solvent at a concentration of about 60 wt % to about 95 wt %.

10. The imprint composition of claim 1, wherein the additive further comprises a diol, an alcohol with three or more alcohol groups, or any combination thereof.

11. The imprint composition of claim 1, wherein the additive further comprises a perfluoroalkyl ether, a polyglycol, a fatty acid, a silane, a siloxane, or any combination thereof.

12. The imprint composition of claim 1, wherein the additive further comprises lauric acid, myristic acid, stearic acid, palmitic acid, dimethyldiethoxysilane, polydimethylsiloxane, polydiphenylsiloxane, hexamethylcyclotrisiloxane, octamethylcyclotetrasiloxane, silanol terminated polydimethylsiloxane, vinyl terminated polydimethylsiloxane, salts thereof, esters thereof, complexes thereof, or any combination thereof.

13. The imprint composition of claim 1, wherein the additive is at a concentration of about 0.01 wt % to about 2.5 wt %, based on the weight of the nanoparticles.

14. The imprint composition of claim 1, wherein the acrylate comprises a methacrylate, an ethylacrylate, a propylacrylate, a butylacrylate, a mono-functional acrylate, a di-functional acrylate, a tri-functional acrylate, or other multi-functional acrylates, or any combination thereof, and wherein the acrylate is at a concentration of about 0.05 wt % to about 10 wt %, based on the weight of the nanoparticles.

15. The imprint composition of claim 1, wherein the imprint composition has a viscosity of 5 cP to about 40 cP, as measured at a temperature of 23° C., and a refractive index of about 1.7 to about 2.0.

16. An imprint composition, comprising:
about 0.5 wt % to about 40 wt % of nanoparticles, wherein each nanoparticle comprises a core and a shell, and wherein the core comprises metal oxide and the shell comprises silicon oxide;
about 50 wt % to about 90 wt % of a solvent;
about 5 wt % to about 40 wt % of a surface ligand, based on the weight of the nanoparticles, the surface ligand comprising oleic acid, stearic acid, propionic acid, benzoic acid, palmitic acid, myristic acid, methylamine, oleylamine, butylamine, or any combination thereof;
about 0.01 wt % to about 5 wt % of an additive, based on the weight of the nanoparticles, the additive comprising fluorosurfactant, fluorocarbon, glycolic acid ethoxylate oleyl ether, or any combination thereof; and
about 0.1 wt % to about 10 wt % of an acrylate, based on the weight of the nanoparticles;
wherein the imprint composition has a viscosity of 5 cP to about 50 cP, as measured at a temperature of 23° C.

17. The imprint composition of claim 16, wherein the viscosity is about 10 cP to about 40 cP, as measured at a temperature of 23° C., and wherein the imprint composition has a refractive index of about 1.7 to about 2.0.

18. An imprint composition, comprising:
nanoparticles, wherein each nanoparticle comprises a core and a shell, and wherein the core comprises metal oxide and the shell comprises silicon oxide;
one or more solvents;
a surface ligand, wherein the surface ligand comprises benzyl alcohol, oleyl alcohol, butanol, octanol, dodecanol, octyltrimethoxy silane, octyltriethoxy silane, octenyltrimethoxy silane, octenyltriethoxy silane, 3-(trimethoxysilyl)propyl methacrylate, propyltriethoxy silane, salts thereof, esters thereof, complexes thereof, or any combination thereof, and wherein the surface ligand is at a concentration of about 6 wt % to about 50 wt %, based on the weight of the nanoparticles;
an additive, wherein the additive comprises one or more of fluorosurfactant, fluorocarbon, glycolic acid ethoxylate oleyl ether, or any combination thereof; and
an acrylate;
wherein the imprint composition has a viscosity of 5 cP to about 50 cP.

19. The imprint composition of claim 18, wherein the imprint composition comprises:
about 1 wt % to about 25 wt % of the nanoparticles;
about 60 wt % to about 85 wt % of the solvent;
about 6 wt % to about 35 wt % of the surface ligand;
about 0.05 wt % to about 3 wt % of the additive, based on the weight of the nanoparticles; and
about 0.3 wt % to about 8 wt % of the acrylate, based on the weight of the nanoparticles.

20. The imprint composition of claim 18, wherein the viscosity is about 10 cP to about 40 cP, as measured at a temperature of 23° C., and wherein the imprint composition has a refractive index of about 1.7 to about 2.0.

* * * * *